United States Patent [19]

Riseman

[11] 4,356,211

[45] Oct. 26, 1982

[54] FORMING AIR-DIELECTRIC ISOLATION REGIONS IN A MONOCRYSTALLINE SILICON SUBSTRATE BY DIFFERENTIAL OXIDATION OF POLYSILICON

[75] Inventor: Jacob Riseman, Poughkeepsie, N.Y.

[73] Assignee: International Business Machines Corporation, Armonk, N.Y.

[21] Appl. No.: 218,155

[22] Filed: Dec. 19, 1980

[51] Int. Cl.[3] .................... H01L 21/265; H01L 21/308

[52] U.S. Cl. .................................... 427/85; 29/576 B; 29/576 W; 29/580; 156/649; 156/653; 156/657; 156/662; 357/49; 357/50; 427/93; 427/94; 427/399; 156/643; 427/262

[58] Field of Search ............... 156/648, 653, 657, 649, 156/643, 662; 357/49, 50; 427/93, 94, 399, 85; 29/576 B, 576 W, 580

[56] References Cited

U.S. PATENT DOCUMENTS

| | | | |
|---|---|---|---|
| 3,874,920 | 4/1975 | Chappelow et al. | 427/85 |
| 4,104,086 | 8/1978 | Bondur et al. | 156/643 |
| 4,140,558 | 2/1979 | Murphy et al. | 156/648 |
| 4,169,000 | 9/1979 | Riseman | 29/580 |
| 4,238,278 | 12/1980 | Antipou | 156/648 |
| 4,264,382 | 4/1981 | Anantha et al. | 156/648 |

*Primary Examiner*—Jerome W. Massie

*Attorney, Agent, or Firm*—Frank C. Leach, Jr.; George O. Saile

[57] ABSTRACT

Dielectric isolation regions are formed in a monocrystalline silicon substrate through forming trenches in the substrate by reactive ion etching after having etched openings in a layered structure of silicon dioxide and silicon nitride on the surface of the substrate. The walls of the trenches in the substrate are oxidized prior to depositing polycrystalline silicon on the substantially vertical side walls of the trenches in the substrate and on the substantially vertical walls defining the openings in the layered structure. By selectively doping the portion of the polycrystalline silicon on the substantially vertical walls of the openings in the layered structure so that the polycrystalline silicon on the substantially vertical walls of the openings in the layered structure will oxidize at least twice as fast as the polycrystalline silicon on the substantially vertical side walls of the trenches in the substrate, thermal oxidation causes the polycrystalline silicon to close the upper end of each of the trenches while leaving an air space therebeneath to form the dielectric isolation regions.

13 Claims, 9 Drawing Figures

29 28 12 29 28 N⁻ N⁺ N⁻ N⁺ N⁻ N⁺ 11 30 30 P⁻ + + + + + + + + 10 22 30 22

FORMING AIR-DIELECTRIC ISOLATION REGIONS IN A MONOCRYSTALLINE SILICON SUBSTRATE BY DIFFERENTIAL OXIDATION OF POLYSILICON

CROSS REFERENCE TO RELATED PATENT APPLICATION

The copending patent application of J. N. Harvilchuck et al, Ser. No. 960,322, filed Nov. 13, 1978, which is a continuation of application Ser. No. 822,775, filed Aug. 8, 1977, now abandoned, and assigned to the same assignee as the assignee of this application is incorporated by reference.

TECHNICAL FIELD

This invention relates to a method for forming dielectric isolation regions in a monocrystalline silicon substrate.

BACKGROUND ART

In U.S. Pat. No. 4,106,050 issued to me, there is disclosed an integrated circuit structure having dielectric isolation regions. In my aforesaid patent, the structure is formed by utilizing two separate substrates with one substrate having cavities therein and fusing a silicon dioxide layer on each substrate to each other and then removing the substrate without the cavities by polishing, grinding, or etching, for example.

The method of the present invention is an improvement of my aforesaid patent in that dielectric isolation regions are formed through utilizing a single substrate. This eliminates the necessity of having to use two separate substrates and fuse a layer of silicon dioxide on each substrate to each other. Thus, the method of the present invention enables the formation of dielectric isolation regions at less time and expense than is required by the method disclosed in my aforesaid patent.

In my aforesaid patent, the open end of each of the air cavities, which are in a first substrate and form the dielectric isolation regions, is closed by a layer of silicon dioxide produced on a second substrate, which is later removed, prior to fusing the silicon dioxide layer to a silicon dioxide layer on the surface of the first substrate having the cavities therein. The present invention produces a product that is an improvement of the integrated circuit structure of my aforesaid patent in that the cavities are closed by electrically insulating material not forming part of the electrically insulating layer over the semiconductor material laterally surrounded by the cavities. Therefore, with the integrated circuit structure of the present invention, the electrically insulating layer can be a different material than the material closing the upper end of each of the air cavities.

SUMMARY OF THE INVENTION

The present invention accomplishes the formation of the cavities with a single substrate by preferably forming trenches in the substrate through openings in an electrically insulating layer on top of the substrate and then disposing selectively doped polycrystalline silicon on the substantially vertical walls of each of the openings and the corresponding trench. Through controlling the doping of the polycrystalline silicon on the substantially vertical walls of each of the openings and the trenches so that the upper portion of the polycrystalline silicon on each of the substantially vertical walls of the openings oxidizes at a rate at least twice as fast as the lower portion of the polycrystalline silicon on the substantially vertical walls of the lower portion of the trenches, thermal oxidation causes the upper portion of the polycrystalline silicon to close the upper open end of each of the trenches while leaving an air space therebeneath. This is because the lower portion of the polycrystalline silicon is oxidizing at a much slower rate.

Thus, this eliminates the need to use two substrates. This also eliminates requiring the electrically insulating layer on the surface of the substrate to be utilized for closing the open end of each of the cavities.

An object of this invention is to provide a method for forming dielectric isolation regions in a semiconductor substrate.

The foregoing and other objects, features, and advantages of the invention will be more apparent from the following more particular description of the preferred embodiment of the invention as illustrated in the accompanying drawings.

DETAILED DESCRIPTION OF PREFERRED EMBODIMENT

Figure 1:
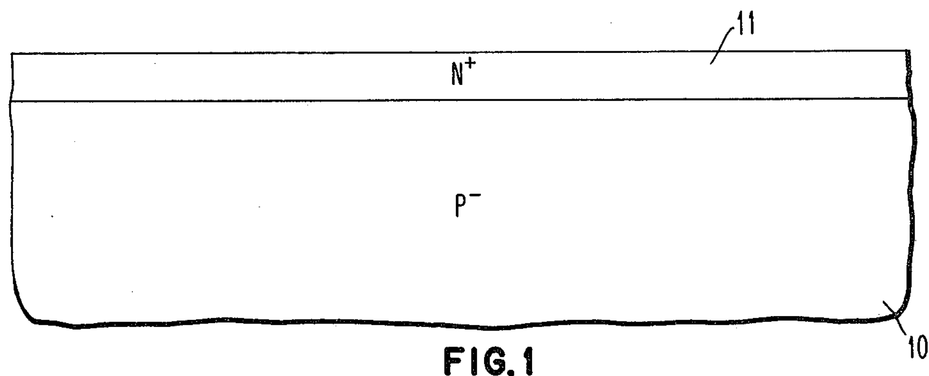
FIGS. 1-9 are diagrammatic sectional views of a portion of an integrated circuit structure showing various steps in forming the dielectric isolation regions in a semiconductor substrate.

Referring to the drawings and particularly FIG. 1, there is shown a P− substrate 10 of monocrystalline silicon having any desired crystal orientation but preferably <100>. The substrate 10 may have a resistivity of 1 to 20 ohms/cm, for example.

An N+ region 11 is formed on top of the substrate 10 by any suitable diffusion. For example, the N+ region 11 may be formed by an ion implantation of arsenic ions having a dose or concentration in a range of $1.5\times10^{16}$ atoms/cm$^2$ and 50 KeV energy. The N+ region 11 will subsequently serve as a subcollector.

Figure 2:
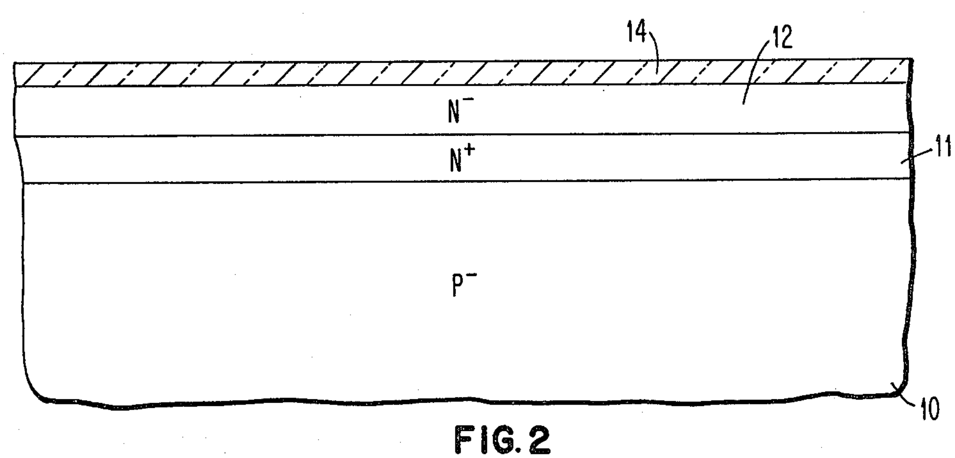

An N-type epitaxial layer 12 (see FIG. 2) is grown from the N+ region 11 by any conventional techniques such as the use of $SiCl_4/H_2$ or $SiH_4/H_2$ mixtures at a temperature of about 1,000° C., for example. The epitaxial layer 12 may have a thickness up to five microns and preferably has a thickness in the range of one to two microns. The epitaxial layer 12 has a maximum impurity concentration or doping level in the range of $3\times10^{16}$ atoms/cm$^3$ to $5\times10^{16}$ atoms/cm$^3$.

After the epitaxial layer 12 has been grown, a layer 14 of silicon dioxide is deposited on top of the epitaxial layer 12. The layer 14 of silicon dioxide may be formed through oxidizing a portion of the epitaxial layer 12, for example. When the layer 14 of silicon dioxide is formed through oxidizing a portion of the epitaxial layer 12, most of the epitaxial layer 12 must remain so that it still has a thickness in the preferred range of at least one to two microns after oxidation. This thermal oxidation may occur in steam at a temperature of 970° C., for example.

Instead of growing the layer 14 of silicon dioxide from the epitaxial layer 12, the layer 14 of silicon dioxide may be deposited by chemical vapor deposition (CVD). The thickness of the layer 14 of silicon dioxide is in the range of 1,000 Å to 10,000 Å and is preferably about 4,000 Å.

After the layer 14 of silicon dioxide has been deposited on top of the epitaxial layer 12, a layer 15 (see FIG. 3) of silicon nitride is deposited on top of the layer 14 of silicon dioxide. The layer 15 of silicon nitride has a thickness in the range of 400 Å to 1,500 Å with the preferred thickness being 1,000 Å.

The layer of silicon nitride is preferably deposited by CVD through a thermal reaction of silane ($SIH_4$) and ammonia ($NH_3$) at a temperature of about 800° C. If desired, the layer 15 of silicon nitride may be deposited at a lower temperature than 800° C. through a plasma of silane and ammonia.

Figure 3:
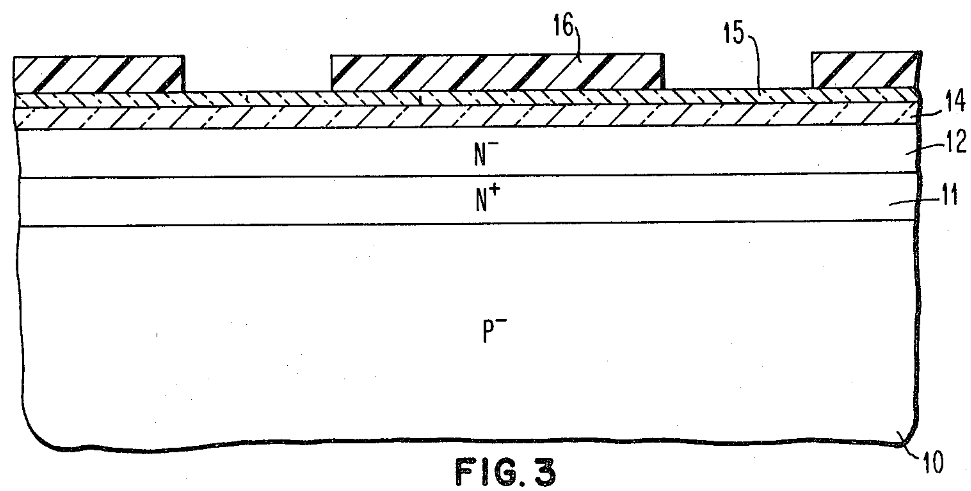

After the layer 15 of silicon nitride is deposited, a mask is then placed over the layer 15 of silicon nitride. The mask is formed by depositing a blanket layer 16 of photoresist and then exposing and developing the layer 16 of photoresist to produce portions of the layer 16 of photoresist as shown in FIG. 3.

Figure 4:
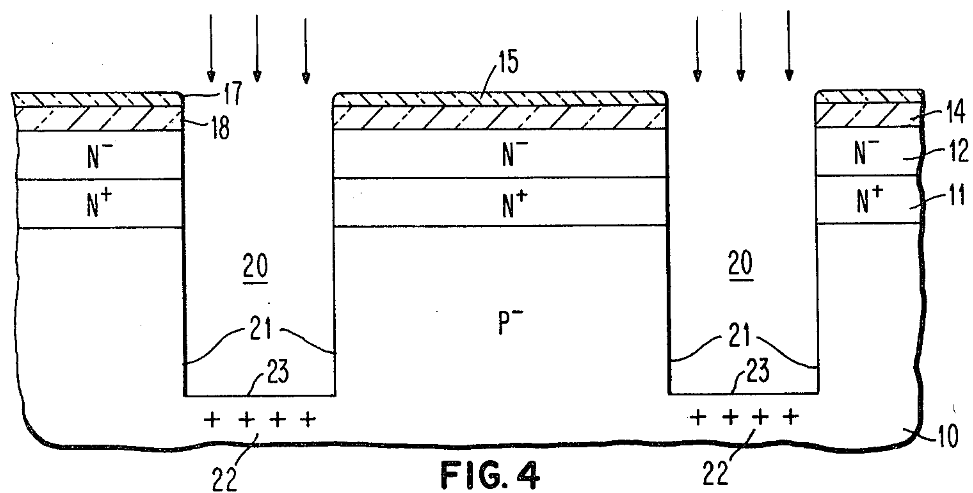

The remaining portions of the layer 16 of photoresist function as a mask to enable etching of openings 17 (see FIG. 4) in the layer 15 of silicon nitride and openings 18 in the layer 14 of silicon dioxide in the areas not protected by the remaining portions of the layer 16 (see FIG. 3) of photoresist. This etching may be either a wet etch or a dry etch.

With a wet etch, the layer 15 of silicon nitride is etched by a solution of hot phosphoric acid ($H_3PO_4$) to form the openings 17 (see FIG. 4) in the layer 15 of silicon nitride. Then, the remaining portions of the layer 16 (see FIG. 3) of photoresist are stripped by a solvent or oxygen plasma, for example.

After the remaining portions of the layer 16 of photoresist have been stripped from the remaining portions of the layer 15 of silicon nitride, the remaining portions of the layer 15 of silicon nitride function as a mask. This enables etching of the openings 18 (see FIG. 4) in the layer 14 of silicon dioxide by a buffered hydrofluoric acid solution, which may be a 7:1 solution, for example.

When a dry etch is utilized, the openings 17 in the layer 15 of silicon nitride are etched by $CF_4$ or $Cl_2$ plasma, for example, in the portions of the layer 15 of silicon nitride not protected by the remaining portions of the layer 16 (see FIG. 3) of photoresist. Next, the substrate 10 is dip etched in a buffered hydrofluoric acid solution, which may be a 7:1 solution, for example, to form the openings 18 (see FIG. 4) in the layer 14 of silicon dioxide not protected by the remaining portions of the layer 15 of silicon nitride. Then, the remaining portions of the layer 16 (see FIG. 3) of photoresist are stripped from the remaining portions of the layer 15 of silicon nitride in the same manner as when a wet etch is employed.

After the openings 17 (see FIG. 4) have been formed in the layer 15 of silicon nitride and the openings 18 have been formed in the layer 14 of silicon dioxide with the openings 17 and 18 being at the locations at which the dielectric isolation regions are to be formed, trenches 20 are cut in the epitaxial layer 12, the N+ region 11, and into the substrate 10. It is necessary to be certain that each of the trenches 20 penetrates into the substrate 10 for the desired electrical isolation between the semiconductor regions of the substrate 10 laterally surrounded by the trenches 20. Thus, the depth of each of the trenches 20 is approximately five microns.

The trenches 20 are preferably formed by reactive ion etching (RIE). This produces substantially vertical side walls 21 in each of the trenches 20.

One suitable example of forming the trenches 20 by RIE is to use a carbon tetrafluoride ($CF_4$) gas. Other suitable examples of the gas are $CCl_4$-Ar and $Cl_2$-Ar. Details of the RIE are described in the aforesaid Harvilchuck et al application, which is incorporated by reference herein and is mentioned in U.S. Pat. No. 4,234,362 issued to me.

It should be understood that the trenches 20 may be formed by other suitable means such as chemical etching, for example. While chemical etching will cause the substantially vertical walls 21 of each of the trenches 20 to be more inclined, the trenches 20 could be formed by chemical etching.

After the trenches 20 have been formed, a channel stopper 22 is formed beneath a bottom wall 23 of each of the trenches 20. The channel stoppers 22 are preferably formed by implanting boron ions having a dose or concentration of $10^{19}$ atoms/$cm^3$. This provides each of the channel stoppers 22 as a P+ area in the P− substrate 10. This avoids any possibility of short circuiting between the various semiconductor regions to be electrically isolated from each other through being laterally surrounded by dielectric isolation regions formed by use of the trenches 20.

Figure 5:
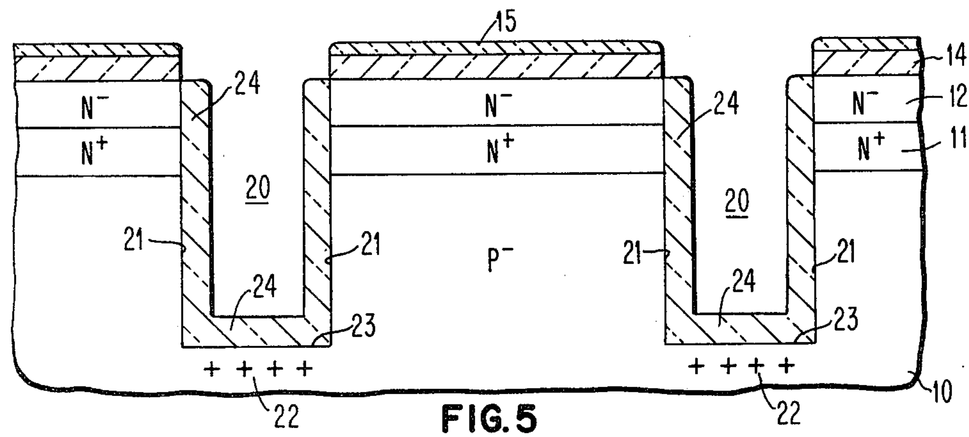

Then, the substantially vertical walls 21 and the substantially horizontal bottom wall 23 of each of the trenches 20 have a layer 24 of silicon dioxide formed thereon. As shown in FIG. 5, the portion of the layer 24 of silicon dioxide on each of the substantially vertical walls 21 of each of the trenches 20 stops at the top of the upper surface of the epitaxial layer 12.

The layer 24 of silicon dioxide is preferably formed by thermal oxidation in steam at a temperature of 970° C., for example. This prevents any formation of oxide on the layer 15 of silicon nitride.

If the layer 24 of silicon dioxide were formed by CVD, this would deposit silicon dioxide on the layer 15 of silicon nitride, and it would be necessary to then remove this deposited layer of silicon dioxide from the layer 15 of silicon nitride. Of course, the layer 24 of silicon dioxide could be deposited by CVD if the extra expense of removing the silicon dioxide from the top of the layer 15 of silicon nitride was immaterial.

The thickness of the layer 24 of silicon dioxide is in a range of 1,000 Å to 5,000 Å. The purpose of the layer 24 of silicon dioxide is to protect the substantially vertical side walls 21 and the substantially horizontal bottom wall 23 of each of the trenches 20.

Figure 6:
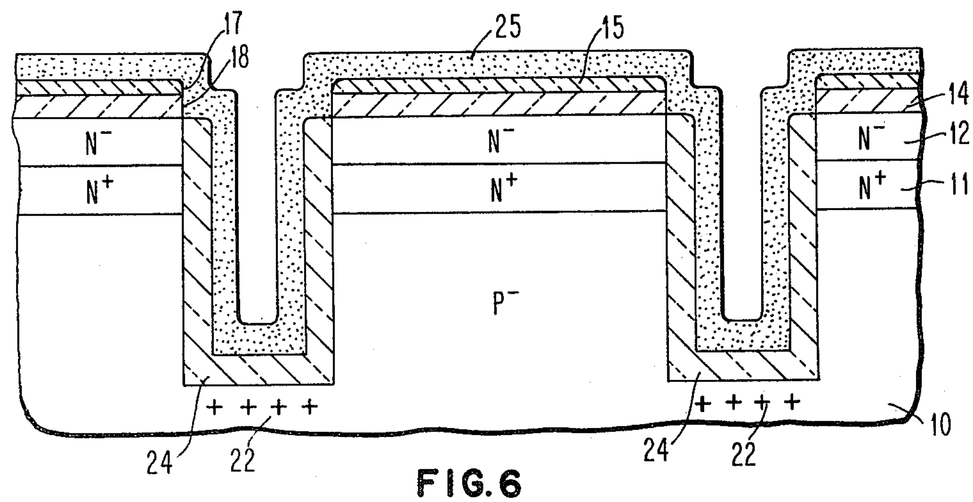

After the layer 24 of silicon dioxide is formed within each of the trenches 20, a layer 25 (see FIG. 6) of polycrystalline silicon is deposited to a thickness of about 5,000 Å as a blanket layer over the substrate 10. This results in the layer 25 of polycrystalline silicon being deposited on top of the layer 15 of silicon nitride, the layer 24 of silicon dioxide, the substantially vertical walls of each of the openings 18 in the layer 14 of silicon dioxide, and the substantially vertical walls of each of the openings 17 in the layer 15 of silicon nitride as a conformal layer.

Figure 7:
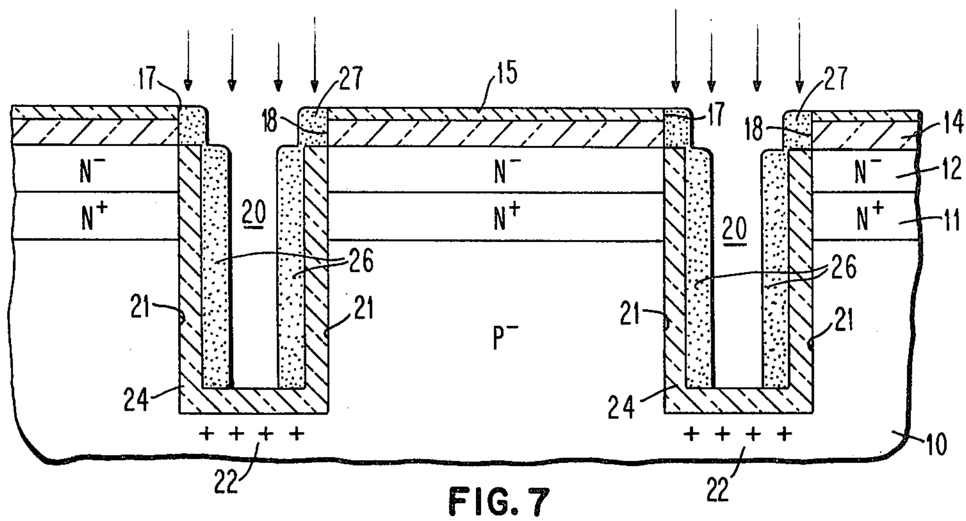

After the layer 25 of polycrystalline silicon is deposited, all of its horizontal portions are removed by RIE in a manner such as that discussed in my aforesaid U.S. Pat. No. 4,234,362. Thus, as shown in FIG. 7, only vertical portions 26 and 27 of the layer 25 of polycrystalline silicon remain. The vertical portions 26 are in contact with the layer 24 of silicon dioxide on the substantially vertical side walls 21 of each of the trenches 20 while the vertical portions 27 contact the substantially vertical side walls of each of the openings 18 in the layer 14 of silicon dioxide and the substantially vertical side walls of each of the openings 17 in the layer 15 of silicon nitride through which access is had to each of the trenches 20.

Then, the vertical portions 27 of the layer 25 of polycrystalline silicon are doped with an impurity so that the vertical portions 27 of the layer 25 of polycrystalline silicon will oxidize at a much faster rate than the vertical portions 26 of the layer 25 of polycrystalline silicon. One suitable means of doping the layer 25 of polycrystalline silicon is to implant phosphorous ions having a dose or concentration of $10^{20}$ atoms/$cm^3$ in the vertical portions 27 of the layer 25 of polycrystalline silicon. This produces a substantial difference in the oxidation rate of the vertical portions 26 of the layer 25 of polycrystalline silicon in each of the trenches 20 in comparison with the vertical portions 27 of the layer 25 of polycrystalline silicon.

Then, the layer 25 of polycrystalline silicon is subjected to thermal oxidation. One suitable means of thermally oxidizing the layer 25 of polycrystalline silicon is to use a low temperature such as about 800° to 900° C., for example, with steam at a relatively high pressure such as 10 to 20 atmospheres, for example.

This will produce about one micron of silicon dioxide in about one hour from the doped vertical portions 27 of the layer 25 of polycrystalline silicon. The undoped vertical portions 26 of the layer 25 of polycrystalline silicon will oxidize at a rate about three to five times slower.

Figure 8:
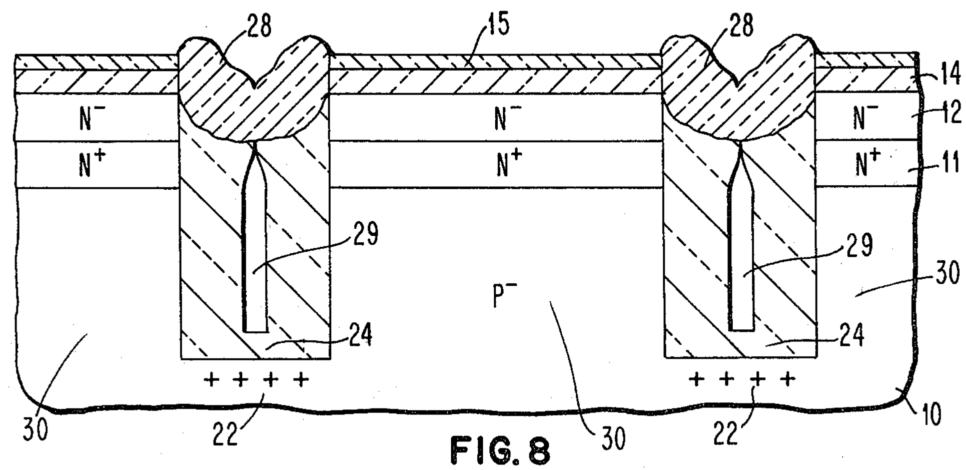

Because the volume of silicon dioxide produced from silicon is about twice the volume of the silicon, the vertical portions 27, when converted to silicon dioxide, will grow towards each other until they engage each other to form a cap 28 of silicon dioxide to seal the upper open end to each of the trenches 20 as shown in FIG. 8. As a result, a dielectric isolation region or cavity 29 is formed in the substrate 10 where each of the trenches 20 has been formed.

This results in the dielectric isolation region 29 being less than three microns in width. However, this is desired since the relatively narrow width of each of the dielectric isolation regions 29 enables an increased number of devices to be formed in the substrate 10 with each of the devices being laterally surrounded by the dielectric regions 29.

If necessary, laser annealing of each of the upper closed ends of each of the trenches 20 can be employed to anneal strains therein. This also would cause any small gaps to flow together.

Figure 9:
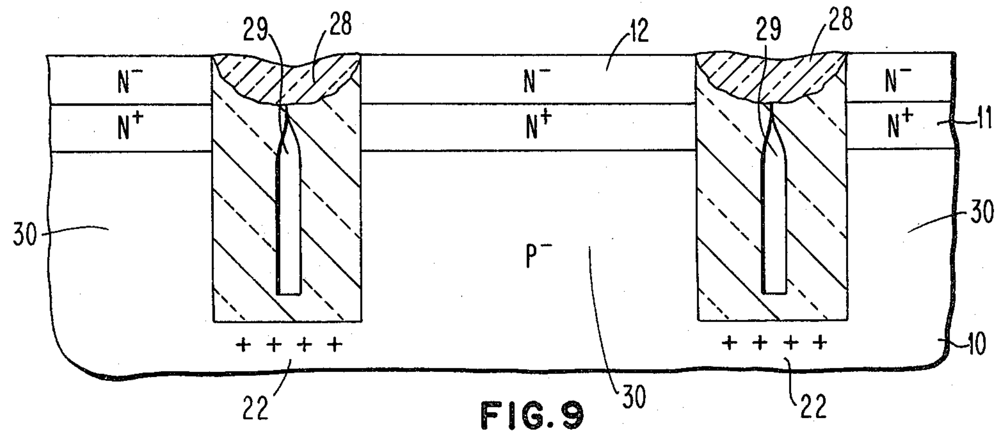

After the dielectric isolation regions 29 are formed, semiconductor regions 30 are electrically isolated from each other and various types of devices may be formed therein. For example, each of the layer 15 of silicon nitride and the layer 14 of silicon dioxide would be removed by etching. The etching of the layer 14 of silicon dioxide also would etch the cap 28 of silicon dioxide, as shown in FIG. 9, to produce a top surface substantially planar with the upper surface of the epitaxial layer 12. Then, standard transistor processing would be employed to produce a device in each of the semiconductor regions 30 in which a device is to be formed.

While the openings 17 (see FIG. 4) in the layer 15 of silicon nitride and the openings 18 in the layer 14 of silicon dioxide have been described as being formed by etching prior to forming the trenches 20 by RIE, it should be understood that the openings 17 in the layer 15 of silicon nitride and the openings 18 in the layer 14 of silicon dioxide could be formed by RIE at the same time that the trenches 20 are formed. Of course, this would require a different gas for forming the openings 17 in the layer 15 of silicon nitride than the gas for forming the openings 18 in the silicon dioxide and the trenches 20 in the substrate 10, the N+ region 11, and the epitaxial layer 12. Thus, a suitable gas for forming the openings 17 in the layer 15 of silicon nitride is $CF_4$ or $Cl_2$-Ar, and a suitable gas for forming the openings 18 in the layer 14 of silicon dioxide is $CF_4$-$H_2$. Any of the same gases, which have been previously mentioned, could be utilized for forming the trenches 20. Therefore, when used in the claims, the term "trench" includes the trench 20 in the substrate 10, the N+ region 11, and the epitaxial layer 12, the aligned opening 17 in the layer 15 of silicon nitride, and the aligned opening 18 in the layer 14 of silicon dioxide.

While the substrate 10 has been disclosed as having a P-type conductivity, it should be understood that it could have an N-type conductivity if desired. Then, all of the other conductivities would be changed to the opposite conductivity from that disclosed.

While the layer 25 of polycrystalline silicon has been shown and described as being doped after being subjected to RIE to leave only the vertical portions 26 and 27, it should be understood that the layer 25 of polycrystalline silicon may be selectively doped prior to RIE. This may be accomplished by depositing the layer 25 of polycrystalline silicon as a selectively doped layer.

An advantage of this invention is that it enables the formation of dielectric isolation regions in a semiconductor substrate at less expense and time than the previously available method. Another advantage of this invention is that it produces substantially less stress than a dielectric isolation structure completely filled with silicon dioxide. Still another advantage of this invention is that it enables narrow dielectric isolation regions to be formed to increase the density of devices on a substrate.

While the invention has been particularly shown and described with reference to a preferred embodiment thereof, it will be understood by those skilled in the art that various changes in form and details may be made therein without departing from the spirit and scope of the invention.

What is claimed is:

1. A method for forming dielectric isolation regions in a monocrystalline silicon substrate including:

- forming a layered structure of silicon dioxide and silicon nitride over a surface of the substrate;
- forming trenches having substantially vertical walls in the layered structure and the substrate where it is desired to form the isolation regions in the substrate;
- forming a channel stopper at the bottom of each of the trenches;
- forming a layer of silicon dioxide on each of the walls of each of the trenches in the substrate;
- forming polycrystalline silicon on each of the substantially vertical walls of each of the trenches in the layered structure and the substrate so that the upper portion of the polycrystalline silicon on each of the substantially vertical walls of the trenches will oxidize at a rate substantially faster than the lower portion of the polycrystalline silicon on each of the substantially vertical walls of the trenches;
- and thermally oxidizing the polycrystalline silicon until the polycrystalline silicon oxidizes to close the upper end of each of the trenches while leaving an air space therebeneath to form the dielectric isolation region.

2. The method according to claim 1 including selectively doping the polycrystalline silicon so that the polycrystalline silicon on the portion of each of the substantially vertical walls of the trenches in the layered structure is doped heavier than the polycrystalline silicon on the portion of each of the substantially vertical walls of the trenches in the substrate so that the polycrystalline silicon on the portion of each of the substantially vertical walls of the trenches in the layered structure oxidizes at least twice as fast as the polycrystalline silicon on the portions of each of the substantially vertical walls of the trenches in the substrate.

3. The method according to claim 2 including forming the layered structure of silicon dioxide and silicon nitride by first forming a layer of silicon dioxide on the surface of the substrate and then forming a layer of silicon nitride on the layer of silicon dioxide.

4. The method according to claim 3 including forming the trenches in the substrate by reactive ion etching.

5. The method according to claim 4 including forming the layer of silicon dioxide on each of the walls of the trenches in the substrate by thermal oxidation.

6. The method according to claim 5 including forming the polycrystalline silicon on each of the substantially vertical walls of each of the trenches by depositing the polycrystalline silicon over the layered structure of silicon dioxide and silicon nitride and the walls of the trenches and removing the polycrystalline silicon from the substantially horizontal surface of the layered structure of silicon dioxide and silicon nitride and the substantially horizontal bottom wall of each of the trenches by reactive ion etching.

7. The method according to claim 1 including forming the trenches in the substrate by reactive ion etching.

8. The method according to claim 7 including forming the layer of silicon dioxide on each of the walls of the trenches in the substrate by thermal oxidation.

9. The method according to claim 8 including forming the polycrystalline silicon on each of the substantially vertical walls of each of the trenches by depositing the polycrystalline silicon over the layered structure of silicon dioxide and silicon nitride and the walls of the trenches and removing the polycrystalline silicon from the substantially horizontal surface of the layered structure of silicon dioxide and silicon nitride and the substantially horizontal bottom wall of each of the trenches by reactive ion etching.

10. The method according to claim 1 including forming the layer of silicon dioxide on each of the walls of the trenches in the substrate by thermal oxidation.

11. The method according to claim 10 including forming the polycrystalline silicon on each of the substantially vertical walls of each of the trenches by depositing the polycrystalline silicon over the layered structure of silicon dioxide and silicon nitride and the walls of the trenches and removing the polycrystalline silicon from the substantially horizontal surface of the layered structure of silicon dioxide and silicon nitride and the substantially horizontal bottom wall of each of the trenches by reactive ion etching.

12. The method according to claim 1 including forming the polycrystalline silicon on each of the substantially vertical walls of each of the trenches by depositing the polycrystalline silicon over the layered structure of silicon dioxide and silicon nitride and the walls of the trenches and removing the polycrystalline silicon from the substantially horizontal surface of the layered structure of silicon dioxide and silicon nitride and the substantially horizontal bottom wall of each of the trenches by reactive ion etching.

13. The method according to claim 1 including forming the channel stopper at the bottom of each of the trenches by implanting ions of the same conductivity as the conductivity of the substrate at the bottom of each of the trenches prior to forming the layer of silicon dioxide on each of the walls of each of the trenches in the substrate.

* * * * *